United States Patent [19] [11] Patent Number: 4,833,434
Takechi [45] Date of Patent: May 23, 1989

[54] SUPERCONDUCTING ELECTROMAGNET FOR NMR IMAGING

[75] Inventor: Moriaki Takechi, Ako, Japan

[73] Assignee: Mitsubishi Denki Kabushiki Kaisha, Japan

[21] Appl. No.: 221,557

[22] Filed: Jul. 20, 1988

[30] Foreign Application Priority Data

Jul. 27, 1987 [JP] Japan .............................. 62-185396

[51] Int. Cl.$^4$ ............................................ H01F 5/00
[52] U.S. Cl. .................................... 335/217; 335/301; 324/318
[58] Field of Search ...................... 335/214, 217, 301; 324/318, 319, 320

[56] References Cited

U.S. PATENT DOCUMENTS 2,172,733  9/1939  Federmann et al. ............... 335/214
4,794,338  12/1988  Roemer et al. ................. 335/299 X

FOREIGN PATENT DOCUMENTS 1190411  5/1970  United Kingdom ............... 335/214

Primary Examiner—George Harris
Attorney, Agent, or Firm—Leydig, Voit & Mayer

[57] ABSTRACT

A superconducting electromagnet for nuclear magnetic resonance imaging has a pair of Z gradient coils surrounded by a heat shield. The heat shield comprises an electrically-conducting tube having one or more cylindrical portions which have longitudinal slits formed therein and at least two annular portions which do not have slits and which are integral with the cylindrical portions. The annular portions are inductively coupled with the Z gradient coils. The axial positions of the centers of the annular portions are selected such that the sum of the cubic term in the expression for the magnetic field generated by eddy currents which are induced in the annular portions and the cubic term in the expression for the magnetic field generated by the Z gradient coils is equal to zero. The resulting composite magnetic field varies substantially linearly along the longitudinal axis of the electromagnet.

2 Claims, 2 Drawing Sheets

SUPERCONDUCTING ELECTROMAGNET FOR NMR IMAGING

BACKGROUND OF THE INVENTION

This invention relates to a superconducting electromagnet for use is a nuclear magnetic resonance (NMR) imaging apparatus, and more particularly to a superconducting electromagnet which can create a magnetic field of high linearity.

FIG. 1 is a longitudinal cross-sectional view of the superconducting electromagnet of a conventional NMR imaging apparatus of the type to which the present invention relates. As shown in this FIGURE, a superconducting coil 1 for generating a high-uniformity static magnetic field is housed within an inner vessel 2 which maintains the coil 1 at a cryogenic temperature. The inner vessel 2 is surrounded and insulated by a vacuum vessel 3. A heat shield 4 for decreasing the penetration of heat into the inner vessel 2 is disposed between the inner vessel 2 and the vacuum vessel 3. It is maintained at a temperature between that of the inner vessel 2 and that of the vacuum vessel 3. The heat shield 4 is made of a material having good thermal conductivity such as copper or aluminum. The inner periphery of the vacuum vessel 3 surrounds a tubular frame 6 which is parallel to the longitudinal axis (the z axis) of the apparatus. Z gradient coils 5 which generate a magnetic field which linearly varies in strength along the z axis in the region in which imaging is performed are wound around the tubular frame 6.

FIG. 2 schematically illustrates the structure of the z gradient coils 5. They can be modelled as a pair of annular coils 5a and 5b of radius $a_c$ having a current $I_c$ flowing through them in opposite directions. In the coordinate system of FIG. 2, the coils 5a and 5b are coaxial with respect to the z axis and the z coordinates of their centers are respectively $+z_c$ and $-z_c$.

The magnetic field B(z) which is formed by the coil system of FIG. 2 at an arbitrary point on the z axis is given by the equation $$B(z) = (\mu_o I_c/a_c) \cdot \{\epsilon_1(\beta) \cdot (z/a_c) + \epsilon_3(\beta) \cdot (z/a_c)^3 + \epsilon_5(\beta) \cdot (z/a_c)^5 + \ldots\} \quad (1)$$

wherein $\mu_o$ is the permeability of empty space, and $\epsilon_1(\beta)$, $\epsilon_3(\beta)$, and $\epsilon_5(\beta)$ are functions of $\beta = z_c/a_c$. When performing NMR imaging, it is desirable that the magnetic field B(z) be as nearly linearly proportional to z as possible near the origin. Such a linearly-varying magnetic field can be obtained by adjusting the positions of the z gradient coils 5a and 5b so that the cubic term and all higher-order terms in Equation (1) vanish. The value of the function $\epsilon_3(\beta)$ is given by the following equation:

$$\epsilon_3(\beta) = \frac{5}{2} \cdot \frac{\beta(3 - 4\beta^2)}{(1 + \beta^2)^{9/2}} \quad (2)$$

Therefore, if $\beta$ is chosen to be $\pm\sqrt{3}/2$, then $\epsilon_3(\beta) = 0$, and the cubic term in Equation (1) will disappear. Furthermore, in the region in which $|z| < a$, all the terms of Equation (1) of 5th order and above are small compared to the linear term and can be ignored. Accordingly, if $\beta$ is set equal to $\pm\sqrt{3}/2$, a magnetic field can be generated which is nearly linearly proportional to the z coordinate in the vicinity of the origin.

However, the above analysis assumes ideal conditions in which only the z gradient coils 5 contribute to the magnetic field. In actual operation, the current passing through the z gradient coils generates eddy currents in the heat shield 4. These eddy currents generate a nonlinearly varying magnetic field, and when this magnetic field is added to the magnetic field expressed by Equation (1), the resulting composite magnetic field does not linearly vary along the z axis.

In order to prevent eddy currents from being induced in the heat shield 4, in some superconducting electromagnets for NMR imaging, the heat shield 4 is divided into a plurality of parallel strip-shaped conductors 4a separated by gaps, as shown in FIG. 3. However, because of the difficulty of electrically insulating the strip conductors 4a from one another and at the same time physically connecting them so as to form a single body, the structure of such a heat shield 4 is complicated and therefore the heat shield 4 is expensive to manufacture.

SUMMARY OF THE INVENTION

Accordingly, it is an object of the present invention to provide a superconducting electromagnet for NMR imaging which can generate a linearly varying magnetic field despite the presence of eddy currents in the heat shield of the electromagnet.

A superconducting electromagnet in accordance with the present invention has a pair of coaxial z gradient coils which are surrounded by a coaxial cylindrical heat shield. The heat shield comprises an electrically-conducting tube having one or more cylindrical portions with longitudinal slits formed therein and at least two annular portions which have no slits therein and which are integral with the cylindrical portions. The slits in the cylindrical portions prevent eddy currents from being induced therein. The axial positions of the annular portions are chosen so that the composite magnetic field which is formed by the current passing flowing through the z gradient coils and by the eddy currents flowing through the annular portions of the heat shield will vary substantially linearly along the longitudinal axis of the electromagnet. Namely, the annular portions are positioned such that the sum of the cubic term in the expression for the magnetic field generated by the z gradient coils and the cubic term in the expression for the magnetic field generated by the eddy currents flowing through the annular portions of the heat shield will equal zero. As the 5th order and higher-order terms in the expressions for the magnetic fields are small enough to be ignored, the expressions for the magnetic fields become linear expressions. Therefore, the magnetic fields which are generated are of good linearity along the z axis.

BRIEF DESCRIPTION OF THE DRAWINGS

In the figures, the same reference numerals indicate the same or corresponding parts.

DESCRIPTION OF THE PREFERRED EMBODIMENT

Figure 1:
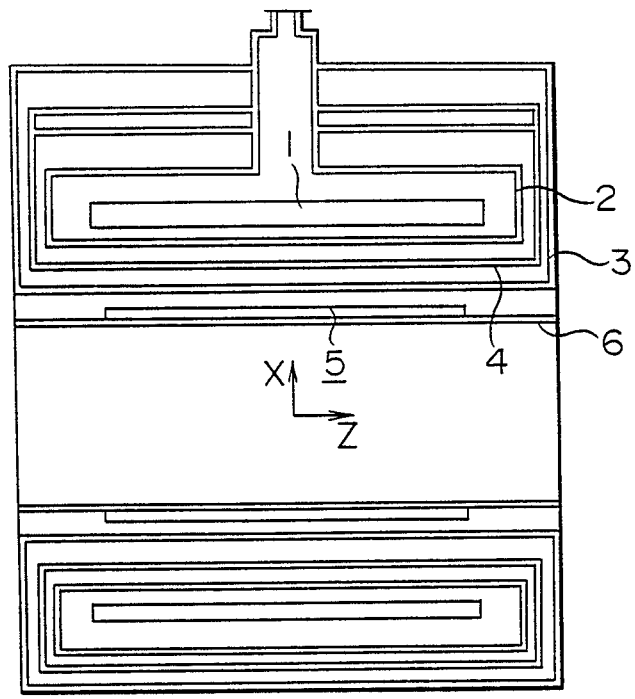
FIG. 1 is a longitudinal cross-sectional view of a conventional superconducting electromagnet for NMR imaging of the type to which the invention relates.
Figure 2:
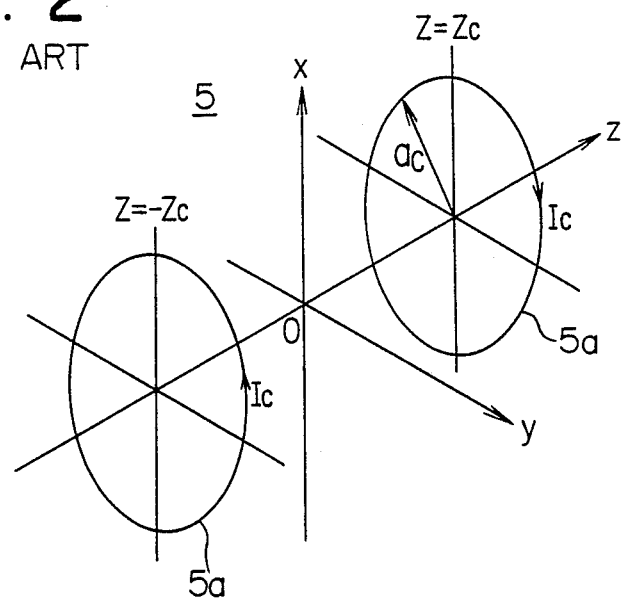
FIG. 2 is a schematic view of the z gradient coils of FIG. 1.
Figure 3:
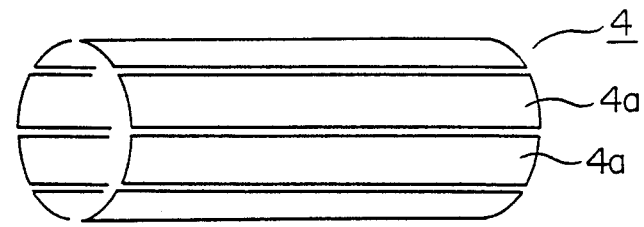
FIG. 3 is a schematic perspective view of a conventional heat shield.
Figure 4:
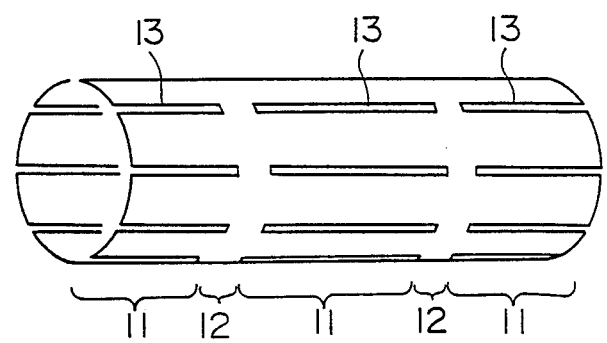
FIG. 4 is a schematic perspective view of a heat shield in accordance with the present invention.

Hereinbelow, a preferred embodiment of a superconducting electromagnet for NMR imaging in accordance with the present invention will be described. The overall structure of this embodiment is similar to that of the conventional electromagnet shown in FIG. 1, the sole difference being the structure of a heat shield 10 which is used in place of the heat shield 4 of FIG. 1. As shown in FIG. 4, the heat shield 10 is an electrically-conducting tubular member comprising three cylindrical portions 11 having longitudinal slits 13 formed therein and a pair of electrically-conducting annular portions 12 which have no slits 13, which are integral with the cylindrical portions 11, and which are disposed therebetween. The slits 13 in the cylindrical portions 11 prevent eddy currents from being induced therein by the magnetic field which is generated by the z gradient coils 5 of the electromagnet. The annular portions 12 are inductively coupled with the z gradient coils 5.

The heat shield 10 can be easily formed by cutting the slits 13 in an electrically-conducting tube by a conventional cutting process. Because the cylindrical portions 11 and the annular portions 12 are integral with one another, the heat shield 10 has excellent mechanical strength and can be inexpensively manufactured.

Each of the annular portions 12 of the heat shield 10 has a radius of $a_s$ and the distance from the center of the electromagnet to each of the centers of the annular portions 12 is $z_s$. The heat shield 10 is installed in the electromagnet in the same manner as the heat shield 4 of FIG. 1.

During the operation of a superconducting electromagnet in accordance with the present invention, when a current is passed through the z gradient coils 5, no eddy currents are induced in the cylindrical portions 11 of the heat shield 10. However, as the z gradient coils 5 are inductively coupled with the annular portions 12 of the heat shield 10, eddy currents are induced in the annular portions 12. If the radius of each of the z gradient coils 5 is $a_c$, the z coordinates of their centers are $\pm z_c$, the current flowing therethrough is $I_c$, the radius of the heat shield 10 is $a_s$, the z coordinates of the annular portions 12 are $\pm z_s$, and the eddy currents are $I_s$, then the composite magnetic field along the z axis which is formed by the current flowing through the z gradient coils 5 and the eddy currents flowing through the annular portions 12 of the heat shield 10 is given by the following equation:

$$B(Z) = (\mu_0 I_c/a_c) \cdot \{\epsilon_1(\beta c) \cdot (Z/ac) + \epsilon_3(\beta c) \cdot (Z/ac)^3 + \epsilon_5(\beta c) \cdot (Z/ac)^5 + \ldots\} - (\mu_0 I_s/as) \cdot \{\epsilon_1(\beta s) \cdot (Z/as) + \epsilon_3(\beta s) \cdot (Z/as)^3 + \epsilon_5(\beta s) \cdot (Z/as)^5 + \ldots\} \quad (3)$$

wherein $\beta_c = z_c/a_c$ and $\beta_s = z_s/a_s$. It can be seen that if the z coordinates $z_s$ of the annular portions 12 of the heat shield 10 are chosen so as to satisfy the following equation, the cubic terms in Equation (3) will cancel one another.

$$(I_c/a_c^4)\epsilon_3(\beta_c) - (I_s/a_s^4)\epsilon_3(\beta_s) = 0 \quad (4)$$

Furthermore, as $a_c < a_s$, in the region where $|z| < a_c$, the terms of 5th order and above in Equation (3) are small enough to be ignored. Accordingly, by choosing $z_s$ so as to satisfy Equation (4), Equation (3) becomes a linear expression in z, which means that the composite magnetic field varies substantially linearly with respect to z, despite the presence of eddy currents.

In the preceding explanation, it was assumed that the cubic term in the expression for the magnetic field generated by the eddy currents flowing through the annular portions 12 is nonzero. However, if the coordinates of the rings 12 are selected such that $$\beta_x = z_s/a_s = \pm\sqrt{3}/2 \quad (5)$$

then $$\epsilon_3(\beta_s) = 0 \quad (6)$$

and regardless of the size of the eddy currents induced in the annular portions 12, the cubic term in the expression for the magnetic field generated by the annular portions 12 will be zero. Therefore, if the z gradient coils are positioned so that $\beta_c = \pm\sqrt{3}/2$, the composite magnetic field can be made to vary linearly iwth respcect to z.

In the illustrated embodiment, the heat shield 10 comprises three cylindrical portions 11 with slits 13 and two annular portions 12 disposed between the cylindrical portions 11. However, as long as there are at least two annular portions 12, and as long as the annular portions 12 are disposed such that the sum of the cubic term in the expression for the magnetic field which is generated by the eddy currents in the annular portions 12 and the cubic term in the expression for the magnetic field which is generated by the z gradient coils is zero, there is no restriction on the number of cylindrical portions 11 or annular portions 12.

What is claimed is:

1. A superconducting electromagnet for nulcear magnetic resonance imaging comprising:

a pair of z gradient coils which are coaxial with respect to the longitudinal axis of said electromagnet; and a tubular heat shield which is coaxially disposed around said z gradient coils, said tubular heat shield comprising an electrically-conducting tube having at least one cylindrical portion which has longitudinal slits formed therein and at least two annular portions which do not have slits and which are integral with said cylindrical portions, said annular portions being inductively coupled with said z gradient coils whereby eddy currents are induced in said annular portions when current flows through said z gradient coils, the axial positions of the centers of said annular portions being such that the sum of the cubic term in the expression for the magnetic field which is generated by said eddy currents in said annular portions and the cubic term in the expression for the magnetic field generated by said z gradient coils when current flows therethrough is equal to zero.

2. A superconducting electromagnet as claimed in claim 1, wherein the axial positions of the centers of said annular portions is such that the cubic term in the expression for the magnetic field which is generated by siad eddy currents in said annular portions is equal to zero.

* * * * *